US009473851B2

(12) United States Patent
Galal et al.

(10) Patent No.: US 9,473,851 B2
(45) Date of Patent: Oct. 18, 2016

(54) SPEAKER PROTECTION CIRCUIT WITH IMPROVED ACCURACY

(71) Applicant: QUALCOMM, Incorporated, San Diego, CA (US)

(72) Inventors: Sherif Galal, Irvine, CA (US); Xinwang Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 80 days.

(21) Appl. No.: 14/579,756

(22) Filed: Dec. 22, 2014

(65) Prior Publication Data

US 2016/0182998 A1 Jun. 23, 2016

(51) Int. Cl.
| | |
|---|---|
| H04R 3/00 | (2006.01) |
| H03G 11/00 | (2006.01) |
| H03G 3/20 | (2006.01) |
| H03F 1/52 | (2006.01) |
| H03F 3/185 | (2006.01) |
| H03F 3/217 | (2006.01) |
| H04R 29/00 | (2006.01) |

(52) U.S. Cl.
CPC ............ *H04R 3/007* (2013.01); *H03F 1/523* (2013.01); *H03F 3/185* (2013.01); *H03F 3/2173* (2013.01); *H03G 3/20* (2013.01); *H03G 11/00* (2013.01); *H03F 2200/03* (2013.01); *H03F 2200/321* (2013.01); *H03F 2200/462* (2013.01); *H03F 2203/45138* (2013.01); *H04R 29/003* (2013.01)

(58) Field of Classification Search
None
See application file for complete search history.

(56) References Cited

U.S. PATENT DOCUMENTS

| | | | | |
|---|---|---|---|---|
| 7,286,010 B2* | 10/2007 | Chieng | ................. | H03F 3/2173 330/10 |
| 7,312,654 B2* | 12/2007 | Roeckner | ................ | H03F 1/305 330/10 |
| 7,463,089 B1* | 12/2008 | Bapat | ....................... | H03F 3/217 330/10 |
| 7,652,531 B2 | 1/2010 | Wang et al. | | |
| 7,994,853 B2 | 8/2011 | Chao | | |
| 8,138,832 B2 | 3/2012 | Yu et al. | | |
| 2006/0104451 A1 | 5/2006 | Browning et al. | | |
| 2008/0111619 A1 | 5/2008 | Matamura | | |
| 2013/0033319 A1* | 2/2013 | Chen | ........................ | H03F 1/32 330/251 |
| 2013/0120063 A1 | 5/2013 | Lesso | | |
| 2013/0136278 A1 | 5/2013 | Quilter | | |
| 2013/0223649 A1* | 8/2013 | Srivastava | .............. | H03F 1/523 381/104 |
| 2014/0169571 A1* | 6/2014 | Polleros | ................. | H04R 3/007 381/55 |
| 2014/0177850 A1 | 6/2014 | Quan et al. | | |

(Continued)

OTHER PUBLICATIONS

Berkhout M., et al., "A 4Ω 2.65W Class-D Audio Amplifier With Embedded DC-DC Boost Converter, Current Sensing ADC and DSP for Adaptive Speaker Protection", IEEE journal of solid-state circuits, vol. 48, No. 12, Dec. 2013, pp. 2952-2961.

(Continued)

*Primary Examiner* — Brenda Bernardi
(74) *Attorney, Agent, or Firm* — Loza & Loza LLP

(57) ABSTRACT

In one embodiment, a method for speaker operation comprises sensing an input common mode signal of a driver, wherein the driver drives a speaker, and adjusting the input common mode signal of the driver based on a difference between the sensed input common mode signal and a reference signal. The method also comprises sensing a current of a coil of the speaker, and control an output volume of the speaker based at least in part on the sensed current.

24 Claims, 9 Drawing Sheets

(56) References Cited

U.S. PATENT DOCUMENTS

| | | | |
|---|---|---|---|
| 2014/0321656 A1* | 10/2014 | Kim .................. | H04R 3/007 381/58 |
| 2015/0181334 A1* | 6/2015 | Ishii .................. | H04R 9/022 381/55 |
| 2015/0189427 A1* | 7/2015 | Tsai .................. | H04R 3/007 381/190 |
| 2015/0215704 A1* | 7/2015 | Magrath ............ | H04R 9/022 381/55 |
| 2016/0043696 A1* | 2/2016 | Raimondi .......... | H03F 1/0205 381/120 |
| 2016/0105746 A1* | 4/2016 | Berthelsen ......... | H04R 3/007 381/55 |

OTHER PUBLICATIONS

Nagari A., et al.,"An 8Ω 2.5 W 1%-THD 104 dB(A)-Dynamic-Range Class-D Audio Amplifier With Ultra-Low EMI System and Current Sensing for Speaker Protection", IEEE journal of solid-state circuits, vol. 47, No. 12, Dec. 2012, pp. 3068-3080.

Jiang X., et al., "An 8Ω, 1.75W, 95% efficiency, 0.004% THD+N Class-D amplifier with a feed-forward ADC and feedback filters," IEEE Asian Solid-State Circuits Conference (A-SSCC), 2013, pp. 369-372.

International Search Report and Written Opinion—PCT/US2015/061528—ISA/EPO—Feb. 17, 2016.

* cited by examiner

SPEAKER PROTECTION CIRCUIT WITH IMPROVED ACCURACY

BACKGROUND

1. Field

Aspects of the present disclosure relate generally to speakers, and more particularly, to speaker protection.

2. Background

Audio loudness in mobile devices may have a significant impact on user experience. For this reason, higher output volume is becoming a requirement in mobile devices (e.g., tablets and cell phones). To provide higher volume, speaker drivers are required to deliver higher output power to speakers. However, micro speakers used in mobile devices cannot withstand being continuously driven at high power due to, for example, excessive membrane excursion and overheating. However, high power can be delivered to a micro speaker for a short period of time as long as the membrane excursion and the voice coil temperature of the speaker are monitored. Once the speaker approaches a failure limit (sensed using a monitoring circuit), this information is fed back to a volume controller to lower the volume and keep the speaker in a safe operating region.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for speaker operation is described herein. The method comprises sensing an input common mode signal of a driver, wherein the driver drives a speaker, and adjusting the input common mode signal of the driver based on a difference between the sensed input common mode signal and a reference signal. The method also comprises sensing a current of a coil of the speaker, and controlling an output volume of the speaker based at least in part on the sensed current.

A second aspect relates to an apparatus for operating a speaker. The apparatus comprises means for sensing an input common mode signal of a driver, wherein the driver drives a speaker, and means for adjusting the input common mode signal of the driver based on a difference between the sensed common mode signal and a reference signal. The apparatus also comprises means for sensing a current of a coil of the speaker, and means for controlling an output volume of the speaker based at least in part on the sensed current.

A third aspect relates to a system for operating a speaker. The system comprises an amplifier and modulation circuit configured to receive an audio signal, to amplify the audio signal, and to generate first and second pulse signals based on the amplified audio signal using pulse width modulation. The system also comprises a circuit configured to drive a driver based on the first and second pulse signals, wherein the driver drives a speaker. The system further comprises a common mode feedback (CMFB) circuit configured to sense an input common mode signal of the driver, to generate at least one feedback signal based on the sensed input common mode signal, and to provide the at least one feedback signal to the amplifier and modulation circuit, the amplifier and modulation circuit being configured to adjust the input common mode signal based on the at least one feedback signal. The system further comprises a monitoring circuit configured to sense a current of a coil of the speaker, and a processor configured to control an output volume of the speaker based at least in part on the sensed current.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
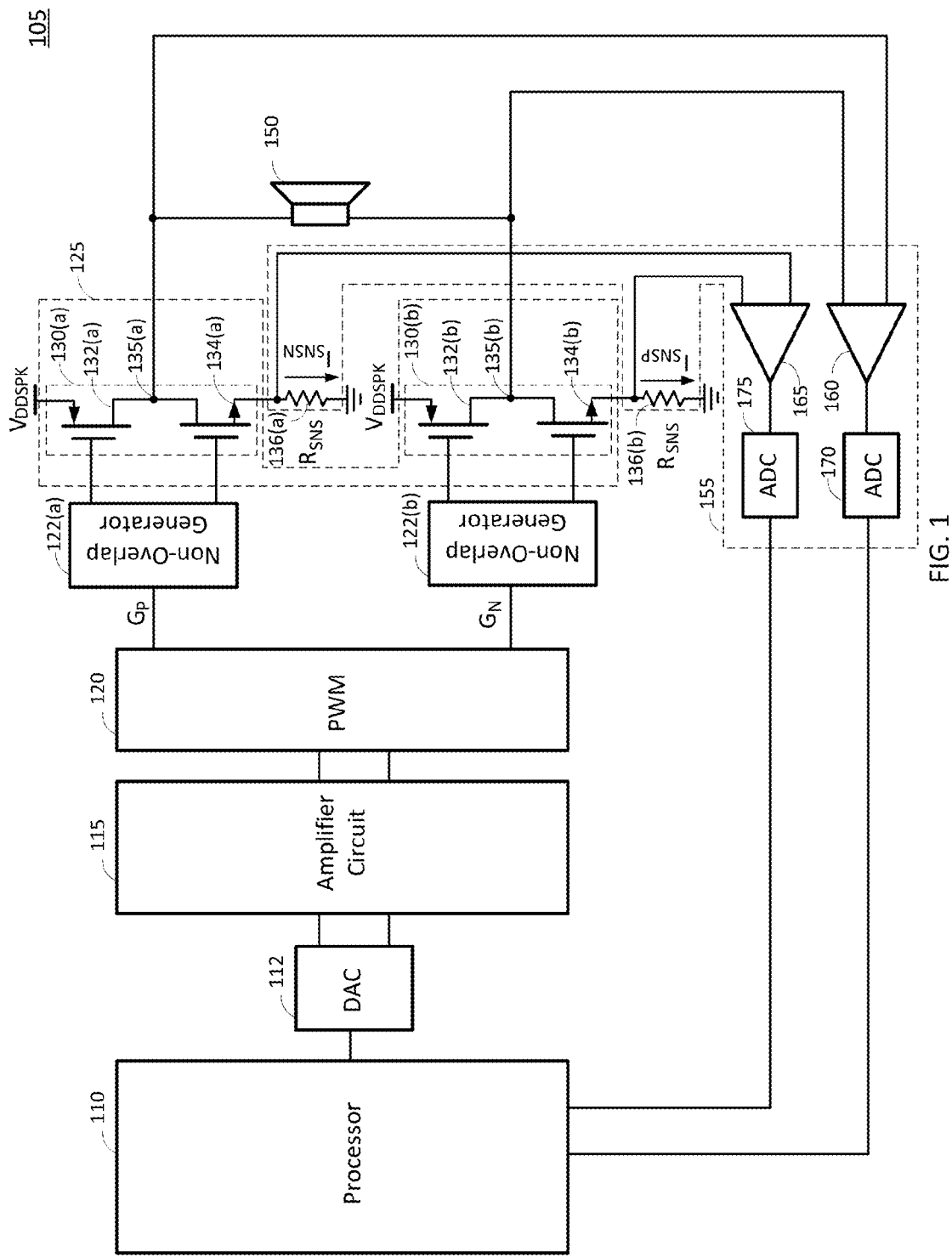
FIG. 1 shows an example of an audio system according to an embodiment of the present disclosure.

FIG. 1 shows an example of an audio system 105 according to an embodiment to the present disclosure. The audio system 105 comprises a digital processor 110, a digital-to-analog converter (DAC) 112, an amplifier circuit 115, a pulse width modulator 120, a first non-overlap generator 122(a), a second non-overlap generator 122(b), a class-D driver stage 125, and a speaker 150.

In operation, the processor 110 outputs a digital audio signal to the DAC 112, which converts the digital audio signal into an analog differential audio signal for input to the amplifier circuit 115. The differential audio signal may comprise two complementary signals. The amplifier circuit 115 amplifies the differential audio signal, and may comprise one or more amplifier stages. For example, the amplifier 115 may comprise one or more integrating amplifier stages (integrator stages), as discussed further below. Although not shown in FIG. 1, it is to be understood that the outputs of the class-D driver stage may be fed back to the amplifier circuit 115 via feedback resistors (e.g., to adjust the gain and/or bandwidth of the amplifier circuit 115), as discussed further below.

The amplifier circuit 115 outputs the amplified differential audio signal to the pulse width modulator 120. The pulse width modulator 120 converts each one of the two signals making up the differential audio signal into a pulse signal (denoted "$G_P$" and "$G_n$") comprising a series of pulses, in which the widths of the pulses are modulated by the amplitude of the signal. Although the pulse width modulator 120 and the amplifier circuit 115 are shown separately in FIG. 1 for ease of illustration, it is to be appreciated that the pulse width modulator 120 and the amplifier circuit 115 may share components.

Figure 2:
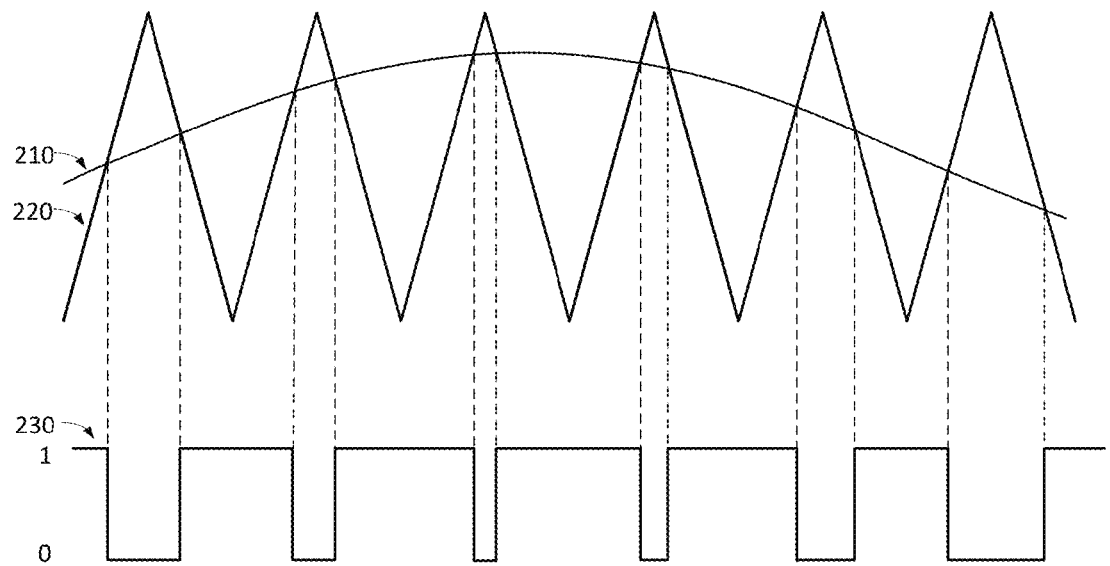
FIG. 2 is a timing diagram illustrating an example of pulse width modulation according to an embodiment of the present disclosure.

FIG. 2 is a timing diagram showing an example of pulse width modulation of one of the signals 210 making up the differential audio signal. In this example, the pulse width modulator 120 compares the signal 210 to a triangle waveform 220 or saw-tooth waveform having a higher frequency than the signal 210. For example, the audio signal may have a frequency up to 20 KHz and the triangle waveform may have a frequency over 100 KHz. When the amplitude of the signal 210 is higher than the triangle waveform 220, the pulse width modulator 120 outputs a high signal (denoted "1"), and, when the amplitude of the signal 210 is below the triangle waveform 220, the pulse width modulator 120 outputs a low signal (denoted "0"). As a result, the pulse width modulator 120 converts the signal 210 into a pulse signal 230 comprising a series of pulses, in which the widths of the pulses are modulated by the amplitude of the signal 210. The pulse width modulator 120 may modulate the other signal making up the differential audio signal in a similar manner.

Referring back to FIG. 1, the pulse width modulator 120 outputs a first pulse signal $G_P$ to the first non-overlap generator 122(a) and outputs a second pulse signal $G_n$ to the second non-overlap generator 122(b). The first and second non-overlap generators 122(a) and 122(b) are configured to prevent "shoot-through" currents in the class-D driver stage 125, as discussed further below.

The class-D driver stage 125 is configured to drive the speaker 150 based on the pulse signals $G_P$ and $G_n$. The class-D driver stage 125 (which may also be referred to as a switching amplifier) is used to drive the speaker 150 because of its high power efficiency compared to other classes of amplifiers. As shown in FIG. 1, the class-D driver stage 125 comprises a first switch driver 130(a) and a second switch driver 130(b).

The first switch driver 130(a) comprises a first PMOS switch 132(a) and a first NMOS switch 134(a) (i.e., PMOS and NMOS transistors operated as switches). The source of the first PMOS switch 132(a) is coupled to supply voltage $V_{DDSPK}$ and the source of the first NMOS switch 134(a) is coupled to ground. The gates of the switches 132(a) and 134(a) are driven by the first non-overlap generator 122(a) and the drains of the switches 132(a) and 134(a) are coupled to output node 135(a).

In operation, the first non-overlap generator 122(a) turns on one of the switches 132(a) and 134(a) at a time based on the amplitude of the first pulse signal $G_P$. When the first pulse signal $G_P$ is high (1), the first non-overlap generator 122(a) turns on the first NMOS switch 134(a), and, when the first pulse signal $G_P$ is low (0), the first non-overlap generator 122(a) turns on the first PMOS switch 132(a).

The first non-overlap generator 122(a) is configured to prevent "shoot-through" current in the first switch driver 130(a). "Shoot-through" current may occur when both switches 132(a) and 134(b) simultaneously conduct current during transition of the first pulse signal $G_P$ from low to high. To prevent this, when the first pulse signal $G_P$ transitions from low to high, the first non-overlap generator 122(a) waits a short period of time (referred to as non-overlap or dead time) for the first PMOS switch 132(a) to turn off before turning on the first NMOS switch 134(a). "Shoot-through" current may also occur when both switches 132(a) and 134(b) simultaneously conduct current during transition of the first pulse signal $G_P$ from high to low. To prevent this, when the first pulse signal $G_P$ transitions from high to low, the first non-overlap generator 122(a) waits a short period of time (referred to as non-overlap or dead time) for the first NMOS switch 134(a) to turn off before turning on the first PMOS switch 132(a). Typically, the switches 132(a) and 134(a) have fast switching times. As a result, the non-overlap times may be made very short to minimize distortion caused by the non-overlap times while still preventing "shoot-through" current.

The second switch driver 130(b) comprises a second PMOS switch 132(b) and a second NMOS switch 134(b) (i.e., PMOS and NMOS transistors operated as switches). The source of the second PMOS switch 132(b) is coupled to supply voltage $V_{DDSPK}$ and the source of the second NMOS switch 134(b) is coupled to ground. The gates of the switches 132(b) and 134(b) are driven by the second non-overlap generator 122(b) and the drains of the switches 132(b) and 134(b) are coupled to output node 135(b).

In operation, the second non-overlap generator 122(b) turns on one of the switches 132(b) and 134(b) at a time based on the amplitude of the second pulse signal $G_N$. When the second pulse signal $G_N$ is high (1), the second non-overlap generator 122(b) turns on the second NMOS switch 134(b), and, when the second pulse signal $G_N$ is low (0), the second non-overlap generator 122(b) turns on the second PMOS switch 132(b). The second non-overlap generator 122(b) is configured to prevent "shoot-through" current in the second switch driver 130(b) in a manner similar to that discussed above for the first non-overlap generator 122(a).

The speaker 150 is coupled between the output nodes 135(a) and 135(b) of the first and second switch drivers 135(a) and 135(b) in an H-bridge configuration, as shown in FIG. 1. In operation, the first and second switch drivers 130(a) and 130(b) drive the speaker 150 with an output signal based on the pulse signals $G_P$ and $G_n$. The output signal causes a varying current to flow through a coil in the speaker 150, which, in turn, causes the coil to produce a varying magnetic field that interacts with the magnetic field of a magnet. This interaction causes the coil to vibrate a membrane mechanically coupled to the coil, thereby producing sound. The coil may also be referred to as a voice coil.

In one aspect, the inductance and resistance of the coil may act as a low pass filter that converts the output signal from the class-D driver stage 125 back into an audio signal (e.g., by smoothing out the output signal). Alternatively, an external low-pass filter (not shown) may be coupled between the class-D driver stage 125 and the speaker 150 to convert the output signal back into an audio signal.

The speaker 150 may be driven with high output power to increase output volume for a better user experience. However, the speaker may not be able to withstand being continuously driven at high power due to, for example, excessive membrane excursion and overheating. However, high power may be delivered to the speaker 150 for a short period of time as long as the membrane excursion and the voice coil temperature of the speaker are monitored. Once the speaker approaches a failure limit (sensed using a monitoring circuit), this information may be fed back to a volume controller to lower the volume and keep the speaker in a safe operating region.

Membrane excursion may be estimated by monitoring the voltage across the speaker 150, and using a speaker model to estimate the excursion based on the voltage. The coil temperature may be indirectly estimated by measuring the coil impedance of the speaker 150. For example, the coil impedance may be measured by measuring the coil voltage and coil current of the speaker since the coil impedance is the ratio of coil voltage over coil current. After estimating the coil impedance, the coil temperature may be estimated using a temperature coefficient of the coil, as discussed further below.

To measure the coil impedance, the audio system 105 may comprise a monitoring circuit 155, as shown in FIG. 1. The monitoring circuit 155 comprises a first differential amplifier 160 and a first analog-to-digital (ADC) converter 170 for measuring the coil voltage. The first amplifier has a first input coupled to output node 135(a), a second input coupled to output node 135(b), and an output coupled to the first ADC 170. Thus, the voltage difference between the two inputs is approximately equal to the voltage across the coil of the speaker 150 (coil voltage). The first amplifier 160 outputs a voltage equal to $G_V*Vpa$ to the ADC 170, where $G_V$ is the gain of the amplifier and Vpa is the voltage across the coil of the speaker 150. The ADC 170 digitizes the output voltage of the first amplifier 160, and outputs the resulting digital signal to the digital processor 110.

The monitoring system 155 also comprises a second differential amplifier 165, a second ADC 175, a first sense resistor 136(a), and a second sense resistor 136(b) for measuring the coil current. The first sense resistor 136(a) is coupled in series with the first NMOS switch 134(a), and the second sense resistor 136(b) is coupled in series with the second NMOS switch 134(b). In the example shown in FIG. 1, the first sense resistor 136(a) is coupled between the source of the first NMOS switch 134(a) and ground, and the second sense resistor 136(b) is coupled between the source of the second NMOS switch 134(b) and ground. Each of the sense resistors 136(a) and 136(b) may have a resistance of $R_{SNS}$, which may be much lower than the resistance of the speaker 150 to keep the voltage drops across the sense resistors low. For example, the speaker 150 may have a resistance of approximately 8Ω, and each of the sense resistors may have a much lower resistance of approximately 50 mΩ.

In operation, the voltage drop across the first sense resistor 136(a) is proportional to the current flowing through the first NMOS switch 134(a) (denoted "$I_{SNSN}$"), and the voltage drop across the second sense resistor 136(b) is proportional to the current flowing through the second NMOS switch 134(b) (denoted "$I_{SNSP}$"). The voltage drop across the first sense resistor 136(a) is input to a first input of the second amplifier 165 and the voltage drop across the second sense resistor 136(b) is input to a second input of the second amplifier 165. Thus, the second amplifier 165 senses the difference between the voltage drops across the sense resistors, which is proportional to the current difference between the sense resistors. The second amplifier amplifies 165 the voltage difference and outputs the amplified voltage difference to the second ADC 175. The second ADC 175 digitizes the output voltage of the second amplifier 165, and outputs the resulting digital signal to the digital processor 110.

The digital processor 110 may use the digital signal from the first ADC 170 to estimate the coil voltage, and the digital signal from the second ADC 175 to estimate the coil current. In one aspect, the digital processor 110 may add a pilot signal to the audio signal in order to measure coil impedance at a well-defined frequency. This is because the frequency of the audio signal may vary within the audio frequency range.

Figure 3:
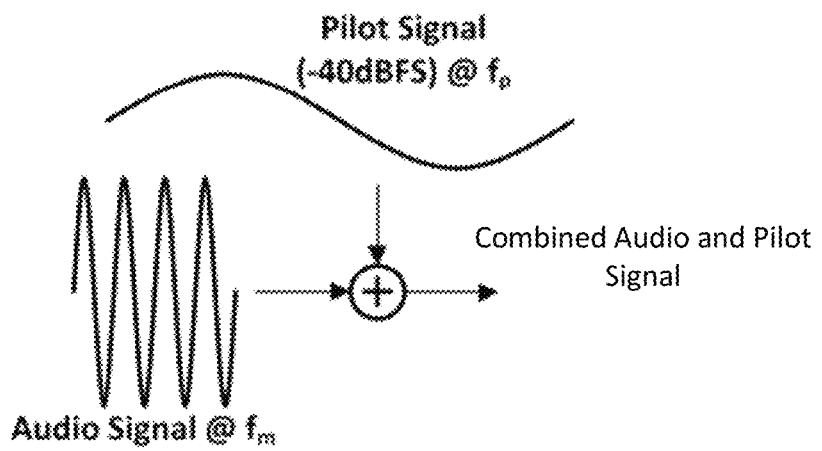
FIG. 3 shows a pilot signal being added to an audio signal according to an embodiment of the present disclosure.

In this regard, FIG. 3 shows an example of the pilot signal being added to the audio signal resulting in a combined audio and pilot signal. In this example, the pilot signal has a small amplitude (e.g., −40 dB) and oscillates at a fixed low inaudible frequency (e.g., 40 Hz). The processor 110 outputs the combined signal to the DAC 112, which converts the combined signal into an analog differential signal and outputs the analog differential signal to the amplifier circuit 115. Thus, the combined signal is processed by the amplifier circuit 115, the pulse width modulator 120 and the class-D driver stage 125.

Figure 4:
FIG. 4 illustrates an operation for determining coil temperature from coil impedance and a temperature coefficient of the coil according to an embodiment of the present disclosure.

In this embodiment, the processor 110 may low-pass filter the digital signal from the first ADC 170 to determine the coil voltage at the pilot frequency, and low-pass filter the digital signal from the second ADC 175 to determine the coil current at the pilot frequency. The processor 110 may then determine the coil impedance at the pilot frequency by taking the ratio of the coil voltage at the pilot frequency over the coil current at the pilot frequency, and using the known temperature coefficient of the coil to estimate the coil temperature. This operation is conceptually shown in FIG. 4, in which $f_p$ is the pilot frequency, $Z_{SPK}$ is the coil impedance, and $I_{SPK}$ is the coil current. In the example in FIG. 4, the coil comprises copper, which has a well-defined temperature coefficient of 0.39%/C.°. However, it is to be appreciated that embodiments of the present disclosure are not limited to this example, and that the coil may comprise another conductive material with a well-defined temperature coefficient.

After estimating the coil temperature, the processor 110 may determine whether the coil temperature is approaching a failure limit (e.g., a temperature at which the speaker is damaged). For example, the processor 110 may do this by comparing the coil temperature to a threshold. In this example, if the coil temperature is above the threshold, then the processor 110 may determine that the coil temperature is too high. If the processor 110 determines that the coil temperature is too high, then the processor 110 may reduce the output volume.

The processor 110 may reduce the volume using any one of a number of different techniques. For example, the processor 110 may scale down the amplitude of the audio signal in the digital domain before outputting the signal to the DAC 112. In another example, the processor 110 may reduce the gain of the amplifier circuit 115. In this example, the processor 110 may reduce the gain by adjusting the resistances of feedback resistors in the amplifier circuit 115.

It is desirable to estimate the coil impedance, and hence coil temperature, with high accuracy. This is because high accuracy allows the processor 110 to operate the speaker 150 at a high volume for a longer period of time while ensuring that the speaker 150 does not reach a failure limit. If the accuracy is low, then the processor 110 may need to build in a large temperature margin to account for the low accuracy. The large margin may cause the processor 110 to reduce the volume while the speaker is still well below the failure limit, resulting in a shorter period of high volume and reduced user experience. Therefore, a more accurate measurement of coil temperature allows the speaker 150 to operate at a high volume for a longer period of time without sacrificing reliability of the speaker 150. In other words, the higher accuracy allows the processor 110 to operate the speaker closer to the failure limit without reaching the failure limit.

The output signal at the speaker 150 may start clipping under high output power, in which the output signal reaches the maximum voltage swing of the driver stage 125. Once the output signal starts clipping, the accuracy of the coil current measurement may degrade significantly, resulting in a relatively large error in the coil temperature. This is a problem because clipping occurs at high output power, and therefore, at a time when it is highly desirable to accurately estimate the coil temperature to prevent speaker damage.

The degradation of the coil current measurement due to clipping will now be discussed with reference to FIGS. 5-9.

Figure 5:
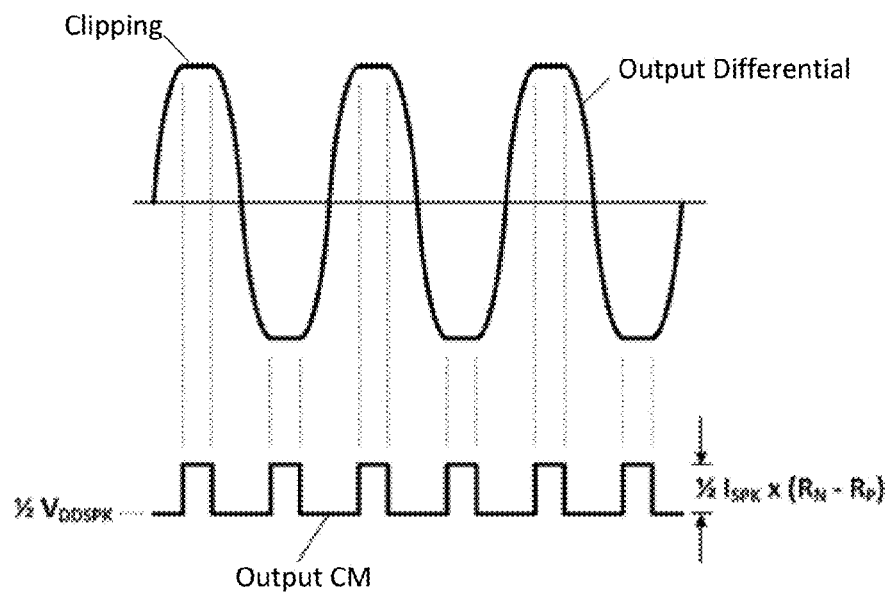
FIG. 5 shows an example of modulation of an output common mode voltage during clipping without a pilot signal according to an embodiment of the present disclosure.

FIG. 5 shows an example of clipping of the output signal when the pilot signal is not present. In this example, it may be assumed that the output common mode voltage is not regulated by a feedback loop to the amplifier circuit 115. As shown in FIG. 5, the output common mode (CM) voltage jumps from ½ $V_{DDSPK}$ each time the output signal is clipped resulting in a series of pulses. The duration of each pulse approximately equals a duration that the output signal is clipped. The frequency of the clipping depends on the frequency of the audio signal, and hence, the frequency of the pulses depends on the frequency of the audio signal.

The amplitude of the pulses is a function of the mismatch in the resistances of the PMOS and NMOS switches in the class-D driver stage 125. In the example in FIG. 5, the amplitude of the pulses is proportional to $R_N$ minus $R_P$, where $R_N$ is the resistance of each NMOS switch plus $R_{SNS}$, and $R_P$ is the resistance of each PMOS switch. The amplitude of the pulses is also proportional to the speaker current. The output common mode voltage may be approximately ½ $V_{DDSPK}$ when the output signal is not clipped.

Figure 6:
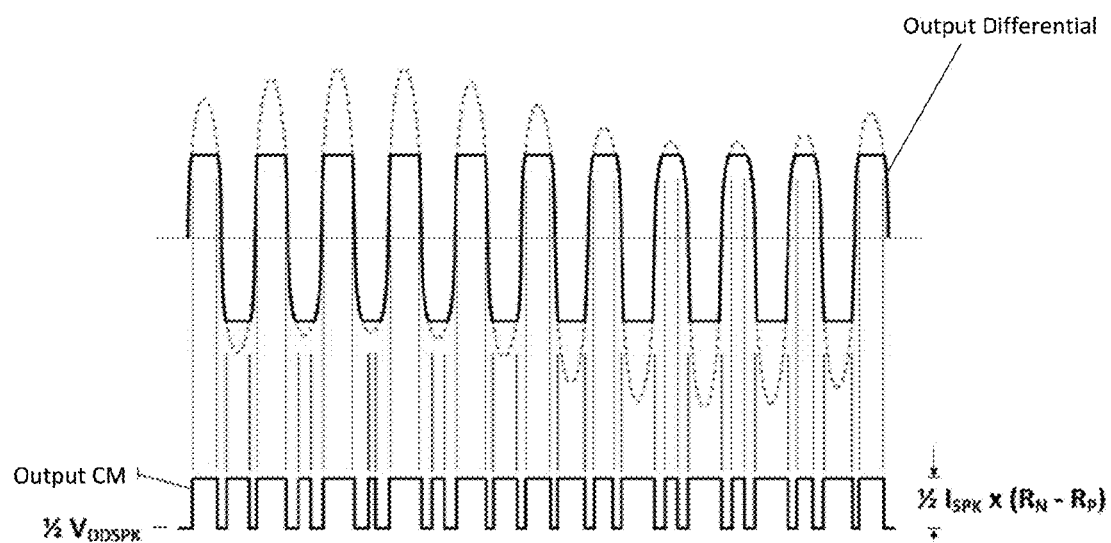
FIG. 6 shows an example of modulation of an output common mode voltage during clipping with a pilot signal according to an embodiment of the present disclosure.

FIG. 6 shows an example of clipping of the output signal when the pilot signal is present. In FIG. 6, the dotted line shows the output signal if the output signal were not clipped. As shown by the dotted line, the amplitude of the output signal is modulated by the pilot signal. The amplitude of the pilot signal modulates the durations of the output signal clips, and therefore modulates the widths of the pulses of the output common mode voltage. The amplitude of the pulses is proportional to $R_N$ minus $R_P$, as discussed above.

FIG. 6 shows the output common mode voltage for the case in which the output common mode voltage is not regulated by a feedback loop to the amplifier circuit 115. For the case in which the output common mode voltage is regulated by a feedback loop to the amplifier circuit 115 (e.g., to be approximately equal to ½ $V_{DDSPK}$), the common mode signal waveform shown in FIG. 6 may be translated to the input of the class-D driver stage 125 with a phase shift of 180 degrees. This is because the feedback loop may regulate the output common mode voltage (e.g., to be approximately equal to ½ $V_{DDSPK}$) by applying the inverse of the common mode signal waveform shown in FIG. 6 to the input of the class-D driver stage 125. Thus, in this case, the input common mode voltage of the class-D driver stage 125 has a series of pulses when the output signal is clipped, in which the amplitude of the pulses is proportional to $R_N$ minus $R_P$ and the widths of the pulses are modulated by the pilot signal.

Figure 7:
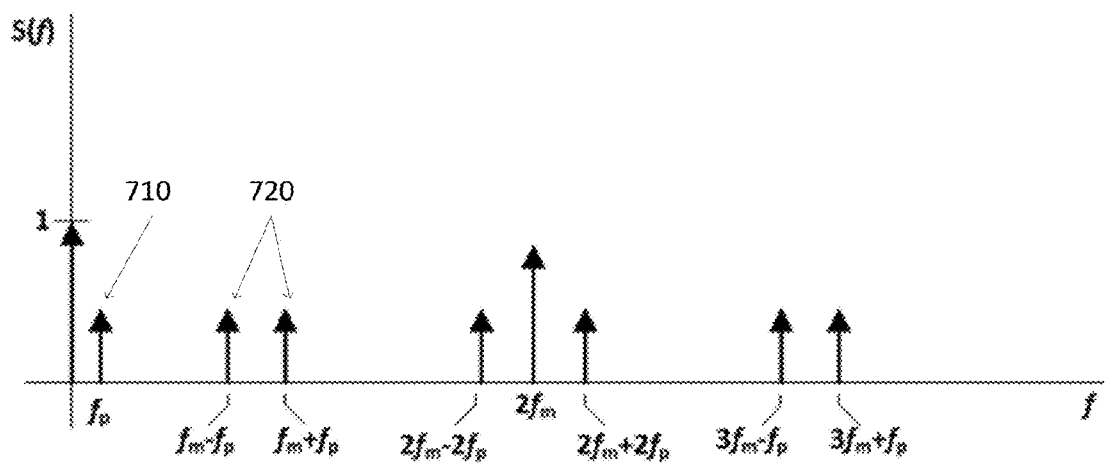
FIG. 7 shows an example of a spectrum of an input common mode signal according to an embodiment of the present disclosure.

FIG. 7 shows a normalized spectrum of the input common mode signal S(f) for the case where the input common mode signal is modulated during clipping, as discussed above. As shown in FIG. 7, the spectrum includes a component 710 at the pilot frequency $f_p$ and inter-modulation components 720 at frequencies $f_m \pm f_p$, where $f_m$ is the frequency of the audio signal (main signal). The spectrum also includes even-order harmonics, as shown in FIG. 7.

Figure 8:
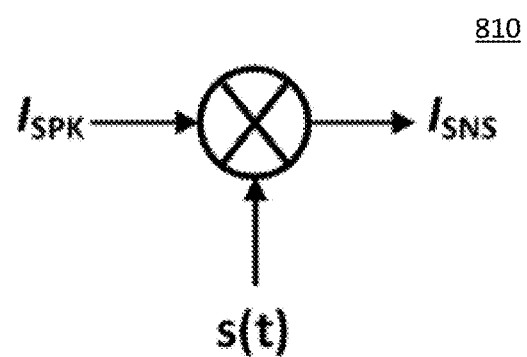
FIG. 8 illustrates mixing of an input common mode signal with a speaker current according to an embodiment of the present disclosure.

In operation, the modulated input common mode signal is mixed with the speaker current at the sense resistors 136(a) and 136(b) by the driver stage 125. A model 810 of this mixing action is shown in FIG. 8, in which the speaker current $I_{SPK}$ is mixed with the modulated input common mode signal s(t) to produce the sense current $I_{SNS}$. The sense current $I_{SNS}$ may be equal to $I_{SNSP}$-$I_{SNSN}$ shown in FIG. 1. As discussed above, the monitoring circuit 155 may sense $I_{SNS}$ by sensing the difference between the voltage drops across the sense resistors, which is proportional to $I_{SNS}$. As a result, the current measurement comprises the speaker current $I_{SPK}$ mixed with the modulated input common mode signal s(t). This can lead to a large error in the current measurement, and hence, the estimated coil impedance.

Figure 9:
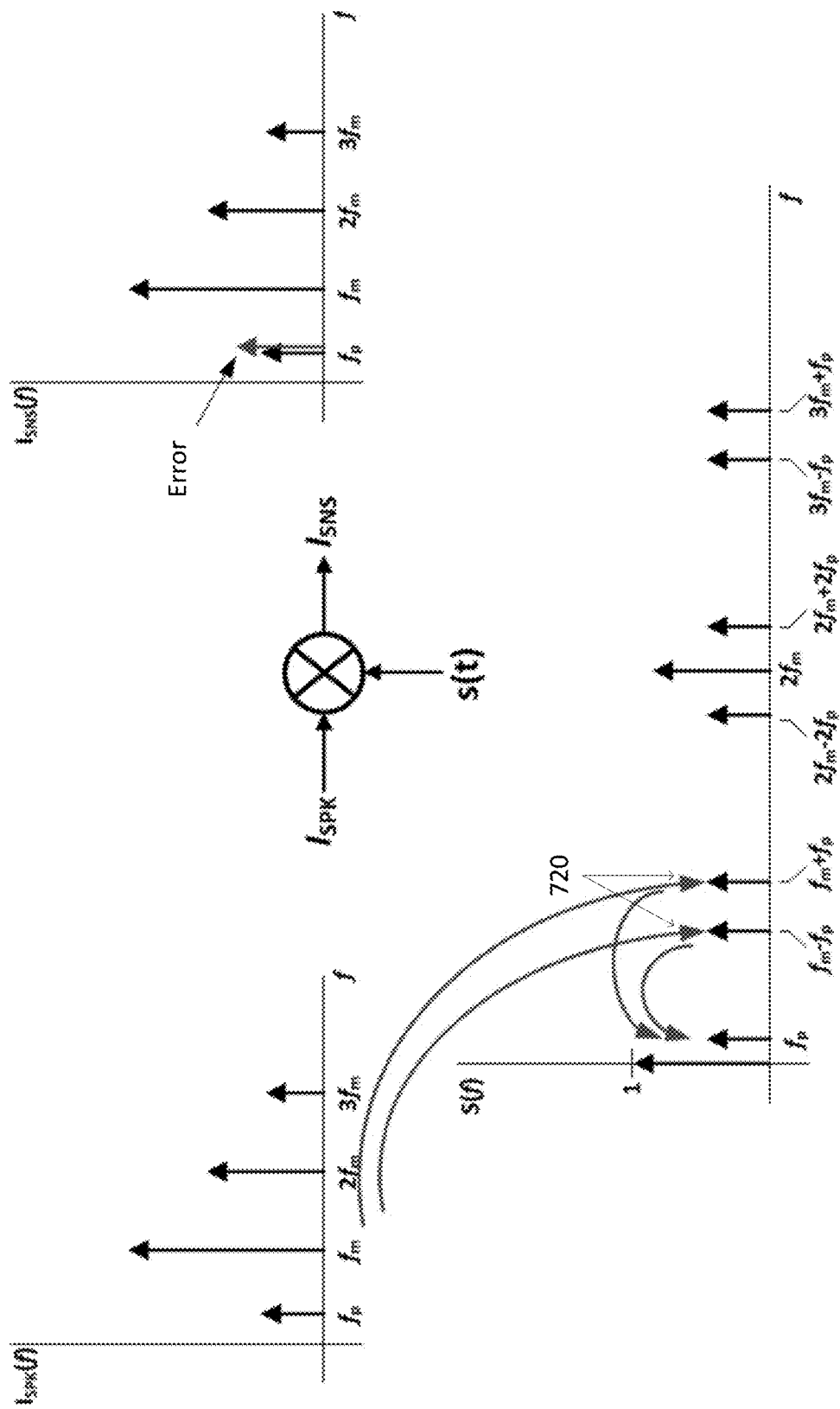
FIG. 9 illustrates error in a sensed current caused by mixing of the input common mode signal with the speaker current according to an embodiment of the present disclosure.

In this regard, FIG. 9 shows the spectrum of the speaker current $I_{SPK}(f)$ and the spectrum of the modulated input common mode signal S(f) before mixing, and the spectrum of the sense current $I_{SNS}(f)$ after mixing. As shown in FIG. 9, the mixing down converts the inter-modulation components 720 of the input common mode signal to around the pilot frequency $f_p$, which is graphically depicted in FIG. 9 by the arrows from the inter-modulation components 720 to the pilot frequency $f_p$. This results in a large error in the sense current $I_{SNS}(f)$ at around the pilot frequency $f_p$. The error at the pilot frequency $f_p$ produces an error in the estimated coil impedance since the coil impedance is estimated at the pilot frequency $f_p$, as discussed above. The error in coil impedance translates into an error in the estimated coil temperature. This error occurs during clipping under high output power, and therefore, at a time when it is highly desirable to accurately estimate the coil temperature to prevent speaker damage.

Embodiments of the present disclosure reduce modulation of the input common mode signal using a common mode feedback topology, thereby reducing the error in the coil current estimate discussed above. This translates into a more accurate coil impedance estimate, and hence, a more accurate coil temperature estimate, allowing the processor 110 to operate the speaker 150 at a high volume for a longer period of time without sacrificing reliability of the speaker 150.

Figure 10:
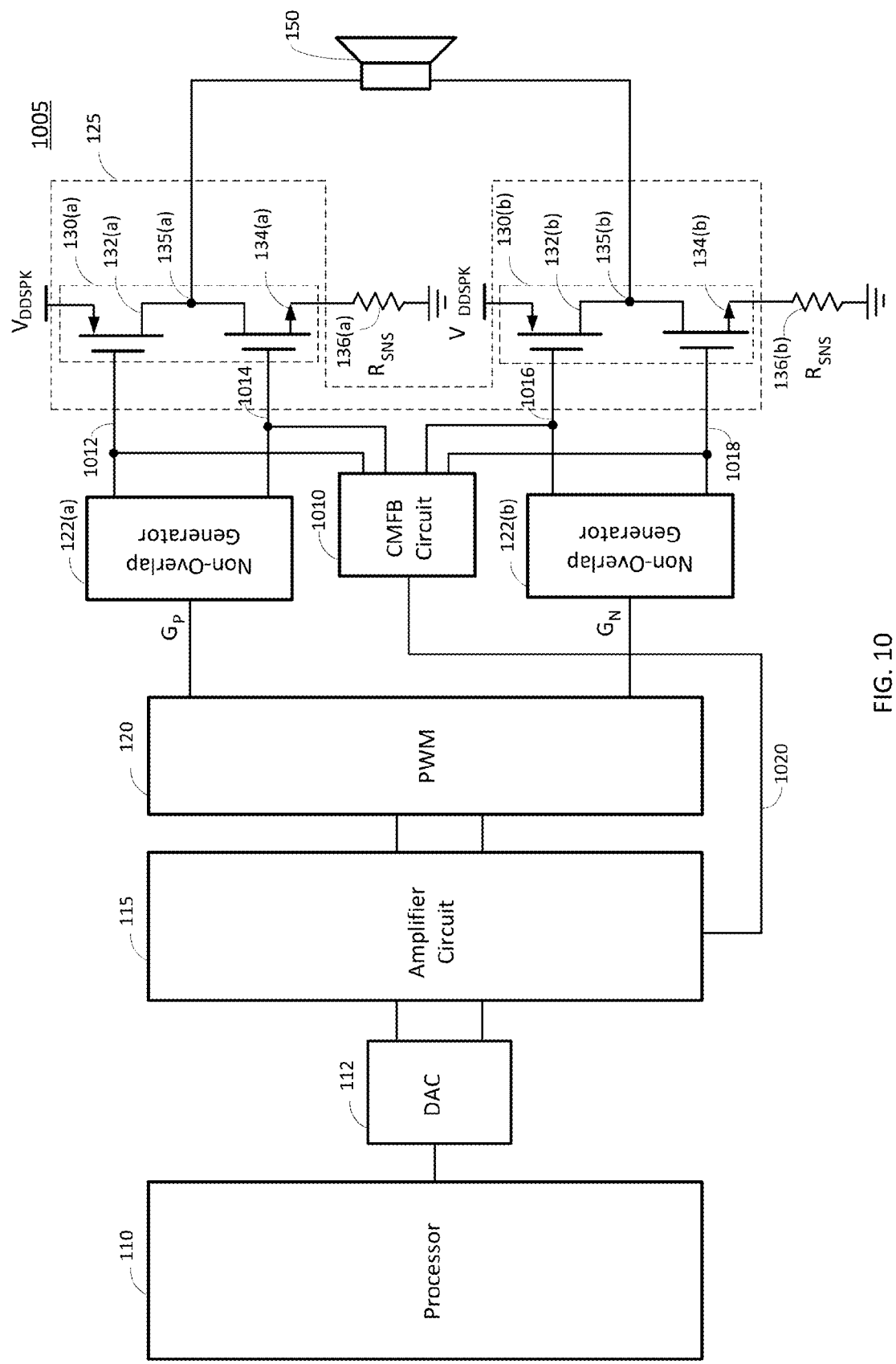
FIG. 10 shows an example of an audio system with common mode feedback according to an embodiment of the present disclosure.

In this regard, FIG. 10 shows an example of an audio system 1005 comprising a common mode feedback (CMFB)

circuit 1010 according to an embodiment of the present disclosure. For ease of illustration, the monitoring circuit 155 is not shown in FIG. 10.

In operation, the CMFB circuit 1010 senses the input common mode voltage of the driver stage 125, compares the sensed input common mode voltage to a reference voltage, and generates a feedback signal 1020 based on the difference (error) between the sensed input common mode voltage and reference voltage. The reference voltage may represent a desired input common mode voltage (e.g., ½ $V_{DDSPK}$). The CMFB circuit 1010 inputs the feedback signal 1020 to the amplifier circuit 115, which causes the amplifier circuit 115 to adjust the input common mode voltage in a direction that reduces the difference (error) between the input common mode voltage and the reference voltage. Thus, the CMFB circuit 1010 forces the input common mode voltage to be approximately equal to the reference voltage, thereby reducing modulation of the input common mode voltage during clipping. This, in turn, reduces the error in the coil impedance estimate caused by modulation of the input common mode signal discussed above.

In the example in FIG. 10, the CMFB circuit 1010 has a first input coupled to the input 1012 of the first PMOS switch 132(a), a second input coupled to the input 1014 of the first NMOS switch 134(a), a third input coupled to the input 1016 of the second PMOS switch 132(b), and a fourth input coupled to the input 1018 of the second NMOS switch 134(b). In this example, the CMFB circuit 1010 senses the input voltages of the switches 132(a), 134(a), 132(b) and 134(b), and senses the input common mode voltage of the driver stage 125 from these voltages.

In one aspect, the first non-overlap generator 122(a) may output the same signal to the first PMOS switch 132(a) and the first NMOS switch 134(a) except during very short non-overlap (dead) times to prevent "shoot-though" current. Thus, the signals to the first PMOS switch 132(a) and the first NMOS switch 134(a) may approximately be considered one signal referred to as a first signal. Similarly, the second non-overlap generator 122(b) may output the same signal to the second PMOS switch 132(b) and the second NMOS switch 134(b) except during very short non-overlap (dead) times to prevent "shoot-though" current. Thus, the signals to the second PMOS switch 132(b) and the second NMOS switch 134(b) may approximately be considered one signal referred to as a second signal. Accordingly, the input common mode voltage of the driver stage 125 may be approximated by the common mode voltage of the first and second signals (the sum of the voltages of the first and second signals divided by two). In this example, the first signal may be approximately equal to the first pulse signal $G_P$ and the second signal may be approximately equal to the second pulse signal $G_N$.

Figure 11:
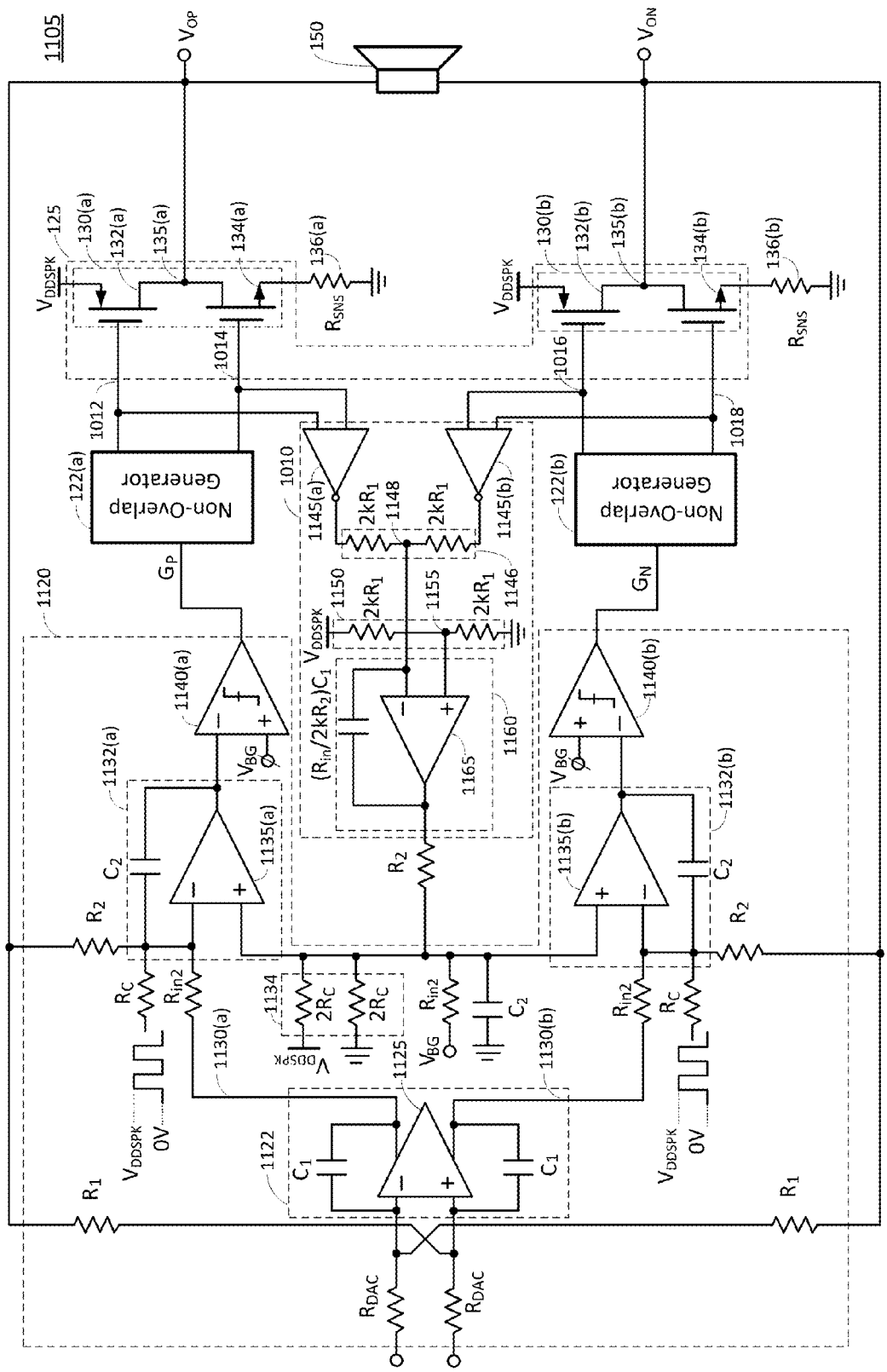
FIG. 11 shows an exemplary implementation of an audio system with common mode feedback according to an embodiment of the present disclosure.

FIG. 11 shows an exemplary implementation of an audio system 1105 with CMFB 1010 according to an embodiment of the present disclosure. The audio system 1105 comprises an amplifier and modulation circuit 1120, which performs the functions of the amplifier circuit 115 and pulse width modulator 120 shown in FIG. 10. For ease of illustration, the processor 110 and the DAC 112 are not shown in FIG. 11.

The amplifier and modulation circuit 1120 comprises a first stage integrator 1122 and two second stage integrators 1132(a) and 1132(b). The first stage integrator 1122 comprises a differential amplifier 1125 and two capacitors $C_1$ where one of the capacitors $C_1$ is coupled between the inverting input of the amplifier 1125 and a first output 1130(a) of the amplifier 1125, and the other capacitor $C_1$ is coupled between the non-inverting input of the amplifier 1125 and a second output 1130(b) of the amplifier 1125. The inverting and non-inverting inputs of the amplifier 1125 are coupled to the DAC 112 by respective resistors $R_{DAC}$. The voltage $V_{OP}$ at output node 135(a) of the driver stage 125 is fed back to the non-inverting input of the amplifier 1125 via a respective feedback resistor $R_1$, and the voltage $V_{ON}$ at output node 135(b) of the driver stage 125 is fed to the inverting input of the amplifier 1125 via a respective feedback resistor $R_1$, as shown in FIG. 11.

The first one of the second stage integrators 1132(a) comprises a first single-ended differential amplifier 1135(a) and a capacitor $C_2$ coupled between the inverting input of the amplifier 1135(a) and the output of the amplifier 1135(a). The first output 1130(a) of the first stage integrator 1122 is coupled to the inverting input of the amplifier 1135(a) via a respective input resistor $R_{in2}$. The voltage $V_{OP}$ at output node 135(a) of the driver stage 125 is fed back to the inverting input of the amplifier 1135(a) via a respective feedback resistor $R_2$. A first square wave signal is coupled to the inverting input of the amplifier 1135(a) via a respective resistor $R_C$, in which the square wave signal may have an amplitude of approximately $V_{DDSPK}$ and a duty cycle of 50%, as shown in FIG. 11. As discussed further below, the square wave signal is used for pulse width modulation.

The second one of the second stage integrators 1132(b) comprises a second single-ended differential amplifier 1135(b) and a capacitor $C_2$ coupled between the inverting input of the amplifier 1135(b) and the output of the amplifier 1135(b). The second output 1130(b) of the first stage integrator 1122 is coupled to the inverting input of the amplifier 1135(b) via a respective input resistor $R_{in2}$. The voltage $V_{ON}$ at output node 135(b) of the driver stage 125 is fed back to the inverting input of the amplifier 1135(b) via a respective feedback resistor $R_2$. A second square wave signal is coupled to the inverting input of the amplifier 1135(b) via a respective resistor $R_C$, in which the square wave signal may have an amplitude of approximately $V_{DDSPK}$ and a duty cycle of 50%, as shown in FIG. 11.

Voltage $V_{BG}$ is coupled to the non-inverting inputs of the amplifiers 1135(a) and 1135(b) via a resistor $R_{in2}$ that matches the resistor $R_{in2}$ coupled to the inverting input of amplifier 1135(a) and the resistor $R_{in2}$ coupled to the inverting input of amplifier 1135(b). The voltage $V_{BG}$ may be approximately equal to the output common mode voltage of the first stage amplifier 1125, which may be approximately equal to ½ $V_{DDSPK}$.

The amplifier and modulation circuit 1120 includes a voltage divider 1134 comprising two resistors $2R_C$ coupled in series between the supply voltage $V_{DDSPK}$ and ground. The non-inverting inputs of the amplifiers 1135(a) and 1135(b) are coupled between the two resistors $2R_C$ of the voltage divider 1134, as shown in FIG. 11. The voltage divider 1134 is equivalent to coupling a voltage of ½ $V_{DDSPK}$ to the non-inverting inputs of the amplifiers 1135(a) and 1135(b) via a resistor $R_C$.

The amplifier and modulation circuit 1120 also comprises a first comparator 1140(a) and a second comparator 1140(b). The first comparator 1140(a) has a one input coupled to the output of the first second stage integrator 1132(a) and a second input biased by voltage $V_{BG}$. The voltage $V_{BG}$ may be approximately equal to the DC output voltage of amplifier 1135(a). The second comparator 1140(b) has a first input coupled to the output of the second second stage integrator 1132(b) and a second input biased by voltage $V_{BG}$. The voltage $V_{BG}$ may be approximately equal to the DC output voltage of amplifier 1135(b).

In operation, the first and second stage integrators amplify the combined audio and pilot signal received from the DAC 112. The resistances of the feedback resistors $R_1$ and $R_2$ and the capacitances $C_1$ and $C_2$ set the gain and bandwidth of first and second stage integrators.

As discussed above, the square wave signals are used to perform pulse width modulation. More particularly, the first square wave signal is input to the first second stage integrator 1132(a), which integrates the first square wave input. The integrator converts the first square wave signal into a triangle signal at the output of the first stage integrator 1132(a). The polarity of the triangle signal may be set such that the triangle signal subtracts from the combined audio and pilot signal at the output of the first second stage integrator 1132(a). As a result, the combined audio and pilot signal minus the triangle signal may be input to the first input of the first comparator 1140(a). In this example, the bias voltage $V_{BG}$ may be approximately equal to the DC output voltage of amplifier 1135(a). As a result, the first comparator 1140(a) may output a high signal (e.g., approximately $V_{DDSPK}$) when the combined audio and pilot signal minus the triangle signal is greater than zero, and, output a low signal (e.g., approximately zero volts) when the combined audio and pilot signal minus the triangle signal is less than zero. This is equivalent to outputting a high signal when the combined audio and pilot signal is greater than the triangle signal, and outputting a low signal when the combined audio and pilot signal is less than the triangle signal. As a result, the first comparator 1140(a) outputs a pulse signal (i.e., the first pulse signal $G_P$) comprising a series of pulses, in which the widths of the pulses are modulated by the amplitude of the respective combined audio and pilot signal.

The second square wave signal is input to the second second stage integrator 1132(b), which integrates the second square wave signal. The integration converts the second square wave signal into a triangle signal at the output of the second second stage integrator 1132(b). The polarity of the triangle signal may be set such that the triangle signal subtracts from the combined audio and pilot signal at the output of the second second stage integrator 1132(b). As a result, the combined audio and pilot signal minus the triangle signal may be input to the first input of the second comparator 1140(b). In this example, the bias voltage $V_{BG}$ may be approximately equal to the DC output voltage of amplifier 1135(b). As a result, the second comparator 1140(b) may output a high signal (e.g., approximately $V_{DDSPK}$) when the combined audio and pilot signal minus the triangle signal is greater than zero, and, output a low signal (e.g., approximately zero volts) when the combined audio and pilot signal minus the triangle signal is less than zero, thereby generating the second pulse signal $G_N$.

Thus, the second stage integrators 1132(a) and 1132(b) may be used to generate the triangle signals used for pulse width modulation. Alternatively, triangle signals may be input to the second inputs of the first and second comparators 1140(a) and 1140(b) to perform pulse width modulation. In this embodiment, all of the resistors $R_C$ and $2R_C$ shown in FIG. 11 may be omitted.

In the example in FIG. 11, the CMFB circuit 1010 comprises a first replica driver 1145(a), a second replica driver 1145(b), and a feedback integrator 1160. The feedback integrator 1160 comprises a single-ended differential amplifier 1165, and a capacitor $(R_{in}/2kR_2)C_1$ coupled between the inverting input of the amplifier 1165 and the output of the amplifier 1165. The capacitor $(R_{in}/2kR_2)C_1$ has a capacitance approximately equal to the capacitance of each of the capacitors $C_1$ in the first stage integrator 1122 multiplied by $(R_{in}/2kR_2)$.

The first and second replica drivers 1145(a) and 1145(b) may be replicas (e.g., scaled-down replicas) of the first and second switch drivers 130(a) and 130(b), respectively. The first replica driver 1145(a) has a first input coupled to the input 1012 of the first PMOS switch 132(a), and second input coupled to the input 1014 of the first NMOS switch 134(a). For example, the first input of the first replica driver 1145(a) may correspond to the input of a PMOS switch in the first replica driver 1145(a), and the second input of the first replica driver 1145(a) may correspond to an input of an NMOS switch in the first replica driver 1145(a). The second replica driver 1145(b) has a first input coupled to the input 1016 of the second PMOS switch 132(b), and second input coupled to the input 1018 of the second NMOS switch 134(b). For example, the first input of the second replica driver 1145(b) may correspond to the input of a PMOS switch in the second replica driver 1145(b), and the second input of the second replica driver 1145(b) may correspond to an input of an NMOS switch in the second replica driver 1145(b).

The CMFB circuit 1010 also comprises a voltage divider 1146 comprising two resistors $2kR_1$ coupled in series between the outputs of the first and second replica drivers 1145(a) and 1145(b). The node 1148 between the two resistors $2kR_1$ provides an estimate of the input common mode voltage of the driver stage 125. The input common mode voltage sensed at node 1148 is coupled to the inverting input of the feedback integrator 1160. The CMFB circuit 1010 further comprises a voltage divider 1150 comprising two resistors $2kR_1$ coupled in series between the supply voltage $V_{DDSPK}$ and ground. The node 1155 between the resistors $2kR_1$ provides a reference voltage approximately equal to $\frac{1}{2} V_{DDSPK}$, and is coupled to the non-inverting input of the feedback integrator 1160. The voltage $\frac{1}{2} V_{DDSPK}$ may represent a desired input common mode voltage. Thus, the difference between the voltages at nodes 1148 and 1155 provides an error signal indicating the difference between the sensed input common mode voltage and desired input common mode voltage, as discussed further below.

The CMFB circuit 1010 also comprises a resistor $R_2$ coupled between the output of the feedback integrator 1160 and the non-inverting inputs of the second stage amplifiers 1135(a) and 1135(b). Thus, the feedback integrator 1160 provides a feedback signal to the non-inverting inputs of the second stage amplifiers 1135(a) and 1135(b) via the resistor $R_2$.

In the example shown in FIG. 11, the common mode feedback loop comprises two integration stages. The first integration stage is provided by the feedback integrator 1160, and the second integration stage is provided by the second stage amplifiers 1135(a) and 1135(b) and a capacitor $C_2$ coupled between the non-inverting inputs of the second stage amplifiers 1135(a) and 1135(b) and ground, as shown in FIG. 11. The output feedback loop also comprises two integration stages provided by the first stage integrator 1122 and the second stage integrators 1132(a) and 1132(b). In this example, the scaling factor k shown in FIG. 11 may be set such that the common mode feedback loop and the output feedback loop have approximately the same or similar loop gain response.

In operation, the feedback integrator 1160 senses the difference between the reference voltage (e.g., $\frac{1}{2} V_{DDSPK}$) at node 1155 and the sensed input common mode voltage at node 1148, and adjusts the voltage at the non-inverting inputs of the second stage amplifiers 1135(a) and 1135(b) via resistor $R_2$ in a direction that reduces the difference. As a result, the CMFB circuit 1010 forces the input common mode voltage of the driver stage 125 to be approximately equal to the reference voltage, thereby reducing modulation of the input common mode voltage during clipping. This, in turn, reduces the error in the coil impedance estimate caused by modulation of the input common mode signal, and therefore provides a more accurate coil temperature measurement.

In this embodiment, resistance mismatch between the PMOS and NMOS switches in the replica drivers 1145(a) and 1145(b) may lead to a small error in the sensed input common mode voltage at node 1148. However, the error is related to the ratio of the resistance mismatch to the input resistance of the feedback integrator 1160, which is relatively high. As a result, the error caused by the resistance mismatch in the PMOS and NMOS switches is very small, and therefore may be ignored.

Figure 12:
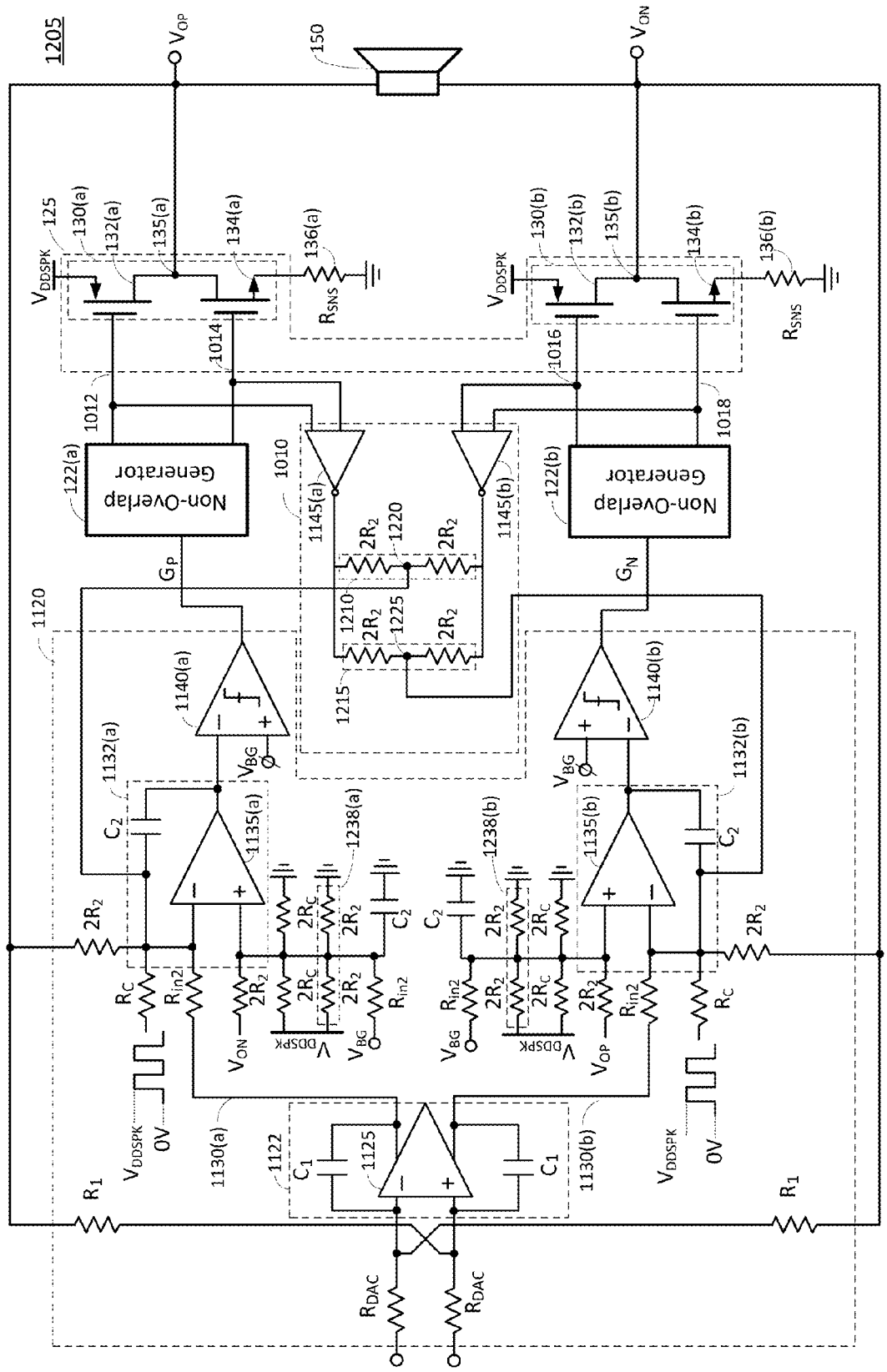
FIG. 12 shows an exemplary implementation of an audio system with common mode feedback according to another embodiment of the present disclosure.

It is to be appreciated that the implementation of the CMFB circuit 1010 shown in FIG. 11 is exemplary only, and therefore that the present disclosure is not limited to this example. For instance, FIG. 12 shows another exemplary implementation of the CMFB 1010 according to another embodiment of the present disclosure. For ease of discussion, descriptions of components that are common to both embodiments are omitted.

In this embodiment, the voltage $V_{OP}$ at output node 135(a) of the driver stage 125 is fed back to the inverting input of the first second stage integrator 1132(a) via a respective feedback resistor $2R_2$, and the voltage $V_{ON}$ at output node 135(b) of the driver stage 125 is fed back to the non-inverting input of the first second stage integrator 1132(a) via a respective feedback resistor $2R_2$. For ease of illustration, the connection between output node 135(b) and the non-inverting input of the first second stage integrator 1132(a) is not explicitly shown in FIG. 12. Thus, the output signal is fed back differentially to the first second stage integrator 1132(a).

The voltage $V_{OP}$ at output node 135(a) of the driver stage 125 is fed back to the non-inverting input of the second second stage integrator 1132(b) via a respective feedback resistor $2R_2$, and voltage $V_{ON}$ at output node 135(b) of the driver stage 125 is fed back to the inverting input of the second second stage integrator 1132(b) via a respective feedback resistor $2R_2$. For ease of illustration, the connection between output node 135(a) and the non-inverting input of the second second stage integrator 1132(b) is not explicitly shown in FIG. 12. Thus, the output signal is fed back differentially to the second second stage integrator 1132(b).

In this embodiment, the non-inverting inputs of the second stage integrators 1132(a) and 1132(b) are split from each other in contrast to the configuration shown in FIG. 11. This is because, in this embodiment, the voltage $V_{ON}$ at output node 135(b) of the driver stage 125 is fed back to the non-inverting input of the first second stage integrator 1132(a) while the voltage $V_{OP}$ at output node 135(a) of the driver stage 125 is fed back to the non-inverting input of the second second stage integrator 1132(b).

In this embodiment, the CMFB circuit 1010 includes a first voltage divider 1210 comprising two resistors $2R_2$ coupled in series between the outputs of the first and second replica drivers 1145(a) and 1145(b). The node 1220 between the resistors $2R_2$ is coupled to the inverting input of the first second stage integrator 1132(a). Thus, the sensed input common mode voltage is fed to the inverting input of the first second stage integrator 1132(a) by the first voltage divider 1210. The CMFB circuit 1010 also includes a second voltage divider 1215 comprising two resistors $2R_2$ coupled in series between the outputs of the first and second replica drivers 1145(a) and 1145(b). The node 1225 between the resistors $2R_2$ is coupled to the inverting input of the second second stage integrator 1132(a). Thus, the sensed input common mode voltage is fed to the inverting input of the second second stage integrator 1132(b) by the second voltage divider 1215.

In this embodiment, the amplifier and modulation circuit 1120 also comprises a first reference voltage divider 1238(a) coupled to the non-inverting input of the first second stage integrator 1132(a). The first reference voltage divider 1238(a) comprises two resistors $2R_2$ coupled in series between the supply voltage $V_{DDSPK}$ and ground, in which the node between the resistors is coupled to the non-inverting input of the first second stage integrator 1132(a). The first reference voltage divider 1238(a) is used to provide a reference voltage for the sensed input common mode voltage input to the inverting input of the first second stage integrator 1132(a). In the example in FIG. 12, the reference voltage may be approximately equal to ½ $V_{DDSPK}$, which may represent a desired input common mode voltage for the driver stage 125.

The amplifier and modulation circuit 1120 also comprises a second reference voltage divider 1238(b) coupled to the non-inverting input of the second second stage integrator 1132(b). The second reference voltage divider 1238(b) comprises two resistors $2R_2$ coupled in series between the supply voltage $V_{DDSPK}$ and ground, in which the node between the resistors is coupled to the non-inverting input of the second second stage integrator 1132(b). The second reference voltage divider 1238(b) is used to provide a reference voltage for the sensed input common mode voltage input to the inverting input of the second second stage integrator 1132(b). In the example in FIG. 12, the reference voltage may be approximately equal to ½ $V_{DDSPK}$, which may represent a desired input common mode voltage for the driver stage 125.

In operation, each of the second stage integrators 1132(a) and 1132(b) senses the difference between the reference voltage (e.g., ½ $V_{DDSPK}$) provided by the respective reference voltage divider 1238(a) and 1238(b) and the respective sensed input common mode voltage, and adjusts the voltage at the respective output in a direction that reduces the difference. As a result, the CMFB circuit 1010 forces the input common mode voltage of the driver stage 125 to be approximately equal to the reference voltage, thereby reducing modulation of the input common mode voltage during clipping.

In this embodiment, an additional integrator (i.e., feedback integrator 1160 in FIG. 11) is not used for CMFB. This reduces the area of the audio system 1205 at the expense of lower gain for the common mode feedback loop since the common mode feedback loop has one integrator stage in this embodiment instead of two integrator stages.

Figure 13:
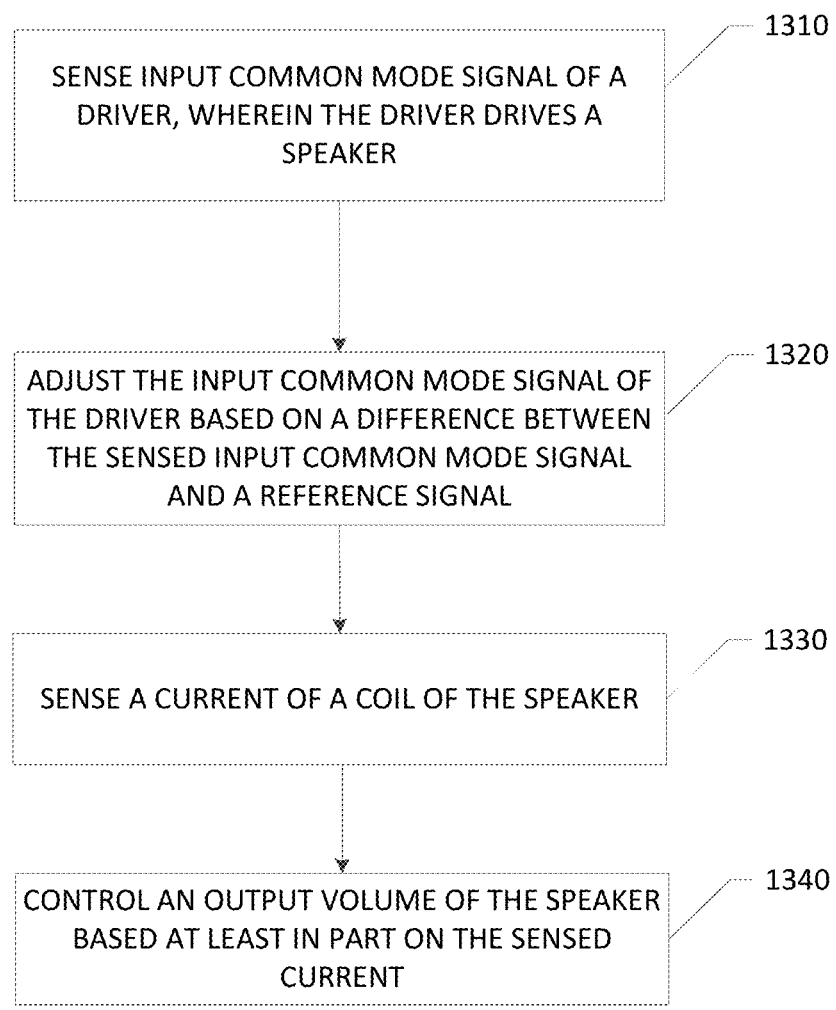
FIG. 13 is a flowchart of a method for speaker operation according to an embodiment of the present disclosure.

FIG. 13 is a flow diagram of a method 1300 for speaker operation according to an embodiment of the present disclosure. The method 1300 may be performed by the audio system 1005, 1105 or 1205.

In step 1310, an input common mode signal of a driver is sensed, wherein the driver drives a speaker. For example, the input common mode signal may be sensed using first and second replica drivers (e.g., replica drivers 1145(a) and 1145(b)) and a voltage divider (e.g., voltage divider 1146, 1210 and/or 1215) coupled between the outputs of the first and second replica drivers. In this example, the voltage divider may comprise two resistors (e.g., resistors $R_1$)

coupled in series, and the input common mode voltage may be sensed at a node between the two resistors. Also, in this example, the driver (e.g., driver stage 125) of the speaker (e.g., speaker 150) may be driven based on first and second pulse signals (e.g., pulse signals $G_P$ and $G_N$), in which the first replica driver (e.g., 1145(*a*)) is driven based on the first pulse signal (e.g., pulse signal $G_P$), and the second replica driver (e.g., 1145(*b*)) is driven based on the second pulse signal (e.g., pulse signal $G_N$). The first and second pulse signals may each comprise a series of pulses, in which the widths of the pulses are modulated by the amplitude of a combined audio and pilot signal.

In step 1320, the input common mode signal of the driver is adjusted based on a difference between the sensed input common mode signal and a reference signal. For example, the reference signal may be approximately equal to half a supply voltage (e.g., ½ $V_{DDSPK}$).

In step 1330, a current of a coil of the speaker is sensed. For example, sense resistors (e.g., 136(*a*) and 136(*b*)) may be coupled in series with the driver (e.g., driver 125), and the current of the coil may be sensed by sensing voltages across the sense resistors.

In step 1340, an output volume of the speaker is controlled based at least in part on the sensed current. For example, an impedance of the coil may be determined based on the sensed current and a voltage across the coil, a temperature of the coil may be determined based on the impedance of the coil and a temperature coefficient of the coil, and the output volume of the speaker may be reduced if the temperature is above a threshold.

The processor 110 may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, may be any conventional processor, controller, microcontroller, or state machine. In some implementations, the processor 110 may include a memory for storing code that, when executed by the processor 110, causes the processor to perform the functions described herein. The memory may comprise RAM memory, flash memory, ROM memory, EPROM memory, EEPROM memory, registers, or any other form of storage medium known in the art.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for speaker operation, comprising:
    driving a speaker using a driver receiving first and second input signals;
    sensing an input common mode signal of the driver using first and second replica drivers being driven with the first and second input signals, respectively, and having outputs coupled to at least one voltage divider, wherein the input common mode signal is sensed at at least one node of the at least one voltage divider;
    adjusting the input common mode signal of the driver based on a difference between the sensed input common mode signal and a reference signal;
    sensing a current of a coil of the speaker; and
    controlling an output volume of the speaker based at least in part on the sensed current.

2. The method of claim 1, wherein the driver comprises at least one class-D driver.

3. The method of claim 1, further comprising:
    sensing a voltage across the coil of the speaker;
    determining an impedance of the coil based on the sensed voltage and the sensed current; and
    determining a temperature of the coil based on the determined impedance of the coil and a temperature coefficient of the coil;
    wherein controlling the output volume of the speaker is based at least in part on the determined temperature.

4. The method of claim 3, further comprising determining whether the determined temperature of the coil is above a threshold, wherein controlling the output volume of the speaker based at least in part on the determined temperature comprises reducing the output volume of the speaker if the determined temperature of the coil is above the threshold.

5. The method of claim 1, wherein sensing the current of the coil comprises sensing a voltage across a sense resistor coupled in series with the driver, and wherein the current of the coil is sensed based at least in part on the sensed voltage.

6. A method for speaker operation, comprising:
    sensing an input common mode signal of a driver, wherein the driver drives a speaker;
    adjusting the input common mode signal of the driver based on a difference between the sensed input common mode signal and a reference signal;
    sensing a current of a coil of the speaker;
    controlling an output volume of the speaker based at least in part on the sensed current;
    adding a pilot signal to an audio signal to produce a combined signal, wherein the pilot signal oscillates at a pilot frequency;
    amplifying the combined signal;
    generating first and second pulse signals based on the amplified combined signal using pulse width modulation; and
    driving the driver of the speaker based on the first and second pulse signals.

7. The method of claim 6, further comprising:
    sensing a voltage across the coil of the speaker;
    determining an impedance of the coil at the pilot frequency based on the sensed voltage and the sensed current; and
    determining a temperature of the coil based on the determined impedance of the coil at the pilot frequency and a temperature coefficient of the coil;
    wherein controlling the output volume of the speaker is based at least in part on the determined temperature.

8. The method of claim 6, wherein the combined signal is amplified using an integrating amplifier, and wherein adjusting the input common mode signal of the driver comprises adjusting a voltage in the integrating amplifier based on the difference between the sensed input common mode signal and the reference signal.

9. The method of claim 6, further comprising:
    driving a first replica driver based on the first pulse signal; and
    driving a second replica driver based on the second pulse signal, wherein a voltage divider is coupled between an output of the first replica driver and an output of the second replica driver, and wherein sensing the input common mode signal comprises sensing a voltage at a node of the voltage divider.

10. An apparatus for operating a speaker, comprising:
means for driving a speaker using a driver receiving first and second input signals;
means for sensing an input common mode signal of the driver using first and second replica drivers being driven with the first and second input signals, respectively, and having outputs coupled to at least one voltage divider, wherein the input common mode signal is sensed at at least one node of the at least one voltage divider;
means for adjusting the input common mode signal of the driver based on a difference between the sensed input common mode signal and a reference signal;
means for sensing a current of a coil of the speaker; and
means for controlling an output volume of the speaker based at least in part on the sensed current.

11. The apparatus of claim 10, wherein the driver comprises at least one class-D driver.

12. The apparatus of claim 10, further comprising:
means for sensing a voltage across the coil of the speaker;
means for determining an impedance of the coil based on the sensed voltage and the sensed current; and
means for determining a temperature of the coil based on the determined impedance of the coil and a temperature coefficient of the coil;
wherein the means for controlling the output volume of the speaker controls the output volume of the speaker based at least in part on the determined temperature.

13. The apparatus of claim 12, further comprising means for determining whether the determined temperature of the coil is above a threshold, wherein the means for controlling the output volume of the speaker comprises means for reducing the output volume if the determined temperature of the coil is above the threshold.

14. An apparatus for operating a speaker, comprising:
means for sensing an input common mode signal of a driver, wherein the driver drives a speaker;
means for adjusting the input common mode signal of the driver based on a difference between the sensed input common mode signal and a reference signal;
means for sensing a current of a coil of the speaker;
means for controlling an output volume of the speaker based at least in part on the sensed current means for adding a pilot signal to an audio signal to produce a combined signal, wherein the pilot signal oscillates at a pilot frequency;
means for amplifying the combined signal;
means for generating first and second pulse signals based on the amplified combined signal using pulse width modulation; and
means for driving the driver of the speaker based on the first and second pulse signals.

15. The apparatus of claim 14, further comprising:
means for sensing a voltage across the coil of the speaker;
means for determining an impedance of the coil at the pilot frequency based on the sensed voltage and the sensed current; and
means for determining a temperature of the coil based on the determined impedance of the coil at the pilot frequency and a temperature coefficient of the coil;
wherein the means for controlling the output volume of the speaker controls the output volume of the speaker based at least in part on the determined temperature.

16. The apparatus of claim 14, wherein the means for adjusting the input common mode signal of the driver comprises adjusting a voltage in the means for amplifying based on the difference between the sensed input common mode signal and the reference signal.

17. A system for operating a speaker, comprising:
an amplifier and modulation circuit configured to receive an audio signal, to amplify the audio signal, and to generate first and second pulse signals based on the amplified audio signal using pulse width modulation;
a circuit configured to drive a driver based on the first and second pulse signals, wherein the driver drives a speaker;
a common mode feedback (CMFB) circuit configured to sense an input common mode signal of the driver, to generate at least one feedback signal based on the sensed input common mode signal, and to provide the at least one feedback signal to the amplifier and modulation circuit, the amplifier and modulation circuit being configured to adjust the input common mode signal based on the at least one feedback signal, wherein the CMFB circuit comprises:
a first replica driver coupled to a first input of the driver;
a second replica driver coupled to a second input of the driver; and
at least one voltage divider coupled between outputs of the first and second replica drivers, wherein the input common mode signal is sensed at at least one node of the at least one voltage driver;
a monitoring circuit configured to sense a current of a coil of the speaker; and
a processor configured to control an output volume of the speaker based at least in part on the sensed current.

18. The system of claim 17, wherein the driver comprises at least one class-D driver.

19. The system of claim 17, wherein the monitoring circuit is further configured to sense a voltage across the coil of the speaker, and the processor is configured to determine an impedance of the coil based on the sensed voltage and the sensed current, to determine a temperature of the coil based on the determined impedance of the coil and a temperature coefficient of the coil, and to control the output volume of the speaker based at least in part on the determined temperature.

20. The system of claim 19, wherein the processor is further configured to reduce the output volume of the speaker if the determined temperature of the coil is above a threshold.

21. A system for operating a speaker, comprising:
an amplifier and modulation circuit configured to receive an audio signal, to amplify the audio signal, and to generate first and second pulse signals based on the amplified audio signal using pulse width modulation;
a circuit configured to drive a driver based on the first and second pulse signals, wherein the driver drives a speaker;
a common mode feedback (CMFB) circuit configured to sense an input common mode signal of the driver, to generate at least one feedback signal based on the sensed input common mode signal, and to provide the at least one feedback signal to the amplifier and modulation circuit, the amplifier and modulation circuit being configured to adjust the input common mode signal based on the at least one feedback signal;

a monitoring circuit configured to sense a current of a coil of the speaker; and a processor configured to control an output volume of the speaker based at least in part on the sensed current;

wherein a pilot signal is added to the audio signal before being input to the amplifier and modulation circuit, and the pilot signal oscillates at a pilot frequency.

22. The system of claim 21, wherein the monitoring circuit is configured to sense a voltage across the coil of the speaker, and wherein the processor is configured to determine an impedance of the coil at the pilot frequency based on the sensed voltage and the sensed current, to determine a temperature of the coil based on the determined impedance of the coil at the pilot frequency and a temperature coefficient of the coil, and to control the output volume of the speaker based at least in part on the determined temperature.

23. The system of claim 17, wherein the CMFB circuit is configured to generate the at least one feedback signal based on a difference between the sensed input common mode signal and a reference signal.

24. The system of claim 17, wherein the amplifier and modulation circuit is configured to adjust the input common mode signal based on a difference between the at least one feedback signal and a reference signal.

* * * * *